United States Patent
Xu et al.

(10) Patent No.: US 9,606,185 B2
(45) Date of Patent: Mar. 28, 2017

(54) INTELLIGENT CALIBRATION SYSTEM FOR BACKUP-POWER AUTOMATIC SWITCHING DEVICE

(71) Applicants: CHANG ZHOU CURRENT SUPPLY COMPANY OF JIANGSU ELECTRIC POWER COMPANY, Changzhou (CN); JIANGSU ELECTRIC POWER COMPANY, Nanjing (CN); STATE GRID CORPORATION OF CHINA, Beijing (CN)

(72) Inventors: Zhen Xu, Changzhou (CN); Yi Wang, Changzhou (CN); Shu Chen, Changzhou (CN); Zuchen Dong, Changzhou (CN); Liang Cao, Changzhou (CN)

(73) Assignees: CHANG ZHOU CURRENT SUPPLY COMPANY OF JIANGSU ELECTRIC POWER COMPANY, Changzhou (CN); JIANGSU ELECTRIC POWER COMPANY, Nanjing (CN); STATE GRID CORPORATION OF CHINA, Beijing (CN)

( * ) Notice: Subject to any disclaimer, the term of this patent is extended or adjusted under 35 U.S.C. 154(b) by 0 days.

(21) Appl. No.: 14/893,048

(22) PCT Filed: Dec. 25, 2013

(86) PCT No.: PCT/CN2013/090405
§ 371 (c)(1),
(2) Date: Nov. 20, 2015

(87) PCT Pub. No.: WO2014/187133
PCT Pub. Date: Nov. 27, 2014

(65) Prior Publication Data
US 2016/0124047 A1    May 5, 2016

(30) Foreign Application Priority Data

May 22, 2013  (CN) .......................... 2013 1 0197034
May 22, 2013  (CN) .................... 2013 2 0289101 U

(51) Int. Cl.
*G01R 31/327* (2006.01)
*G01R 31/319* (2006.01)
(Continued)

(52) U.S. Cl.
CPC ..... *G01R 31/3277* (2013.01); *G01R 31/3191* (2013.01); *G01R 35/005* (2013.01); *H02J 9/06* (2013.01)

(58) Field of Classification Search
CPC .............. G01R 31/327; G01R 31/3271; G01R 31/3277; G01R 31/3278; G01R 31/00;
(Continued)

(56) References Cited

U.S. PATENT DOCUMENTS 6,791,208 B2 * 9/2004 Pfeiffer ..................... H02J 9/06
307/64
7,800,248 B2 * 9/2010 Kramer ..................... H02J 3/38
307/19
(Continued)

FOREIGN PATENT DOCUMENTS

| CN | 201251605 Y | 6/2009 |
| CN | 101750555 A | 6/2010 |

(Continued)

OTHER PUBLICATIONS

The World Intellectual Property Organization (WIPO) International Search Report for PCT/CN2013/090405 Apr. 3, 2014.
(Continued)

*Primary Examiner* — Hoai-An D Nguyen
(74) *Attorney, Agent, or Firm* — Anova Law Group, PLLC

(57) ABSTRACT

The present invention provides an intelligent calibration system for backup-power automatic switching devices, including a power supply module, a control module for logic
(Continued)

controls, a voltage output module and a current output module for outputting simulated voltage and current, a signal feedback module for sampling outputted voltage and current signals, a simulated circuit-breaker group, an auxiliary relay, a USB interface for communication, a keyboard for information input, a display module for information interaction and real-time panel presentation, an interface module to facilitate plug-in wires, an indicator light for indicating operation status and a computer for controlling the testing globally. The present invention facilitates easy and fast wiring, and conveniently displays operation interface and related information. The operation is intuitive and simple, overall test efficiency is improved. Further, comprehensive tests for BAS devices can be performed with high measurement accuracy, while avoiding influences of human operations to the test results.

5 Claims, 3 Drawing Sheets

(51) Int. Cl.
*G01R 35/00* (2006.01)
*H02J 9/06* (2006.01)

(58) Field of Classification Search
CPC .. G01R 31/002; G01R 31/02; G01R 31/3191; G01R 31/31924; G01R 31/343; G01R 35/00; G01R 35/005; G01R 33/0017; G01R 33/0035; G01R 13/30; H02J 9/00; H02J 9/04; H02J 9/06; H01H 1/0015; G08B 29/20; G05B 2219/39052
USPC ....... 324/415, 416, 417, 418, 419, 424, 600, 324/601, 76.11, 130, 202, 500, 537, 324/750.01, 750.02; 702/85; 361/148
See application file for complete search history.

(56) References Cited

U.S. PATENT DOCUMENTS 8,911,248 B1 * 12/2014 Wildstone ............... H01R 4/60
307/65
2008/0197705 A1 8/2008 Dewis

FOREIGN PATENT DOCUMENTS

| CN | 101893665 A | 11/2010 |
|---|---|---|
| CN | 201828618 U | 5/2011 |
| CN | 102353861 A | 2/2012 |
| CN | 102426309 A | 4/2012 |
| CN | 103308797 A | 9/2013 |
| CN | 203287451 U | 11/2013 |
| JP | 2009011082 A | 1/2009 |

OTHER PUBLICATIONS

Li, Shuixiang, et al. Intelligent Field Calibrator for Backup Power Auto-switch-on Device, Instrument Technique and Sensor, 2012, No. 5, May 2012, ISSN1002-1841.

* cited by examiner

INTELLIGENT CALIBRATION SYSTEM FOR BACKUP-POWER AUTOMATIC SWITCHING DEVICE

FIELD OF THE DISCLOSURE

The present disclosure relates to the technical field of testing and inspection devices for power equipment and, more particularly, relates to an intelligent calibration system for backup-power automatic switching device.

BACKGROUND

A backup-power automatic switching device for power grid may automatically provide backup-power to electrical equipment or switch power source of the equipment to the backup-power when the main power source fails due to certain reasons. The backup-power automatic switching device is an automatic safety device that enhances reliability of power supply, and may be abbreviated as BAS. The backup-power automatic switching device is an important equipment in power operation to enhance reliability and continuity of power supply. Nowadays, BAS devices have been widely used. The BAS device is required to be inspected before new installation which puts the device into operation, and is required to be tested and calibrated periodically during operation.

Existing calibration technologies may include simulating circuit parameters such as voltages and currents in actual lines, providing switch input and receiving switch output by simulation circuit breakers, and sampling action time of the BAS device using devices such as time measurement apparatus. These methods have complex wiring during specific work process, cannot simulate some required test items of BAS devices. Further, these methods are not able to accurately simulate some complicated failure sequences. For example, Chinese granted patent publication No. CN 201178332Y, entitled "a debugging device for backup-power automatic switches", discloses a debugging device for BAS including a debugging interface and a debugging circuit. The debugging circuit may accept instructions from the interface and output a debugging status using two dual-position relays with magnetic latches. The debugging device is overly simple and may not accomplish multiple test items required by current BAS devices.

Besides, Chinese granted patent publication No. CN 101504449, entitled "a testing apparatus for backup-power automatic switching devices", discloses a testing apparatus for BAS devices with high level of integration. Despite considerable progress, due to limited conditions, the testing apparatus cannot simulate various scenarios that may potentially occur in reality, especially some unusual circumstances, such as breaker tripping or breaker refusing to action, main transformer failure, manual closing, intertrip, etc. In addition, although the testing apparatus is claimed to have simple wiring, its specific wiring connection device is not disclosed. The testing device cannot simultaneously display usage status, either.

BRIEF SUMMARY OF THE DISCLOSURE

The purpose of the present invention is to overcome the deficiencies of the existing technologies and to provide an intelligent calibration system for backup-power automatic switching (BAS) devices which is simple to wire and connect, is easy to operate, has intuitive display interface and may simulate comparably comprehensive testing items and states of BAS devices.

The technical solution of the present invention is to provide an intelligent calibration system for backup-power automatic switching devices, whose structural characteristics is that the system may include a power supply module, a control module, a voltage output module, a current output module, a signal feedback module, a simulated circuit-breaker group, an auxiliary relay, a USB interface, a keyboard, a display module, an interface module, an indicator light and a computer.

The above-mentioned power supply module may be configured to include a power input port, a first power output port and a second power output port. The control module may be configured to include a voltage output control port, a power output control port, a signal feedback input port, a simulated circuit-breaker signal port, an auxiliary relay control port, a USB communication port, a keyboard signal input port, a display signal input port, an indicator light signal output port and a power port. The voltage output module may be configured to include a control signal input port, a first voltage output port, a second voltage output port and a power port.

The current output module may be configured to include a control signal input port, a current output port and a power port. The signal feedback module may be configured to include a first sampling signal port, a second sampling signal port, a third sampling signal port, a signal output port and a power port. The simulated circuit-breaker group may be configured to include a first signal port, a second signal port and a power port. The auxiliary relay may be configured to include a control signal input port, an output port and a power port.

The USB interface may be configured to include a first communication port and a second communication port. The keyboard may be configured to include a signal output port and a power port. The display module may be configured to include a display signal input port and a power port. The interface module may include an interface panel and a first voltage output connection terminal, a second voltage output connection terminal, a current output connection terminal, a row of simulated circuit-breaker connection terminals and an auxiliary relay output connection terminal configured on the interface panel. The indicator light may be configured to include a control signal input port and a power port. The computer may be configured to include a communication port.

The control signal input port of the voltage output module and the voltage output control port of the control module may be electrically connected. The first voltage output port of the voltage output module and the first voltage output connection terminal of the interface module may be electrically connected. The second voltage output port of the voltage output module and the second voltage output connection terminal of the interface module may be electrically connected. The control signal input port of the current output module and the current output control port of the control module may be electrically connected. The current output port of the current output module and the current output connection terminal of the interface module may be electrically connected.

The first sampling signal port of the signal feedback module and the first voltage output port of the voltage output module may be electrically connected. The second sampling signal port of the signal feedback module and the second voltage output port of the voltage output module may be electrically connected. The third sampling signal port of the signal feedback module and the current output port of the current output module may be electrically connected. The signal output port of the signal feedback module and the feedback signal input port of the control module may be electrically connected.

The first signal port of the simulated circuit-breaker group and the simulated circuit-breaker signal port of the control module may be electrically connected and have bidirectional signal connection. The second signal port of the simulated circuit-breaker group and the row of simulated circuit-breaker connection terminals of the control module may be electrically connected. The control signal input port of the auxiliary relay and the auxiliary relay control port of the control module may be electrically connected. The output port of the auxiliary relay and the output connection terminal of the interface module may be electrically connected.

The first communication port of the USB interface and the USB communication port of the control module may be electrically connected and have bidirectional signal connection. The second communication port of the USB interface and the communication port of the computer may be electrically connected and have bidirectional signal connection. The signal output port of the keyboard and the keyboard signal input port of the control module may be electrically connected. The display signal input port of the display module and the display signal output port of the control module may be electrically connected. The control signal input port of the indicator light and the indicator light signal output port of the control module may be electrically connected.

The power ports of the control module, the simulated circuit-breaker group, the auxiliary relay, the USB interface, the keyboard, the display module and the indicator light may be respectively electrically connected to the first power output port of the power supply module. The power ports of the voltage output module, the current output module and the signal feedback module may be respectively electrically connected to the second power output port of the power supply module.

Further, the system may also include a housing. The above-mentioned housing may include a panel. The above-mentioned display module may include a display driving circuit and a display screen. The above-mentioned power supply module, control module, voltage output module, current output module, signal feedback module, simulated circuit-breaker group, auxiliary relay and driving circuit of the display module may be configured inside the housing. The USB interface, the keyboard, the display screen of the display module, the interface module and the indicator light may be configured on the panel of the housing.

Further, the above-mentioned control module may include an LPC2220 microcontroller. The simulated circuit-breaker group may include eight simulated circuit-breakers. The row of simulated circuit-breaker connection terminals of the control module may include eight groups and a total of sixteen connection terminals.

Further, the above-mentioned connection terminals of the interface module may be MTK-P/P terminals manufactured by PHOENIX Corporation. The above-mentioned display screen of the display module may be TFT touch screen.

Further, the above-mentioned computer may be a computer which includes an operation control unit having a configuration operation interface and a global scheme control, and a test database containing regular test project set, faulty set and typical case set, and which performs global control of the testing.

Figure 1:
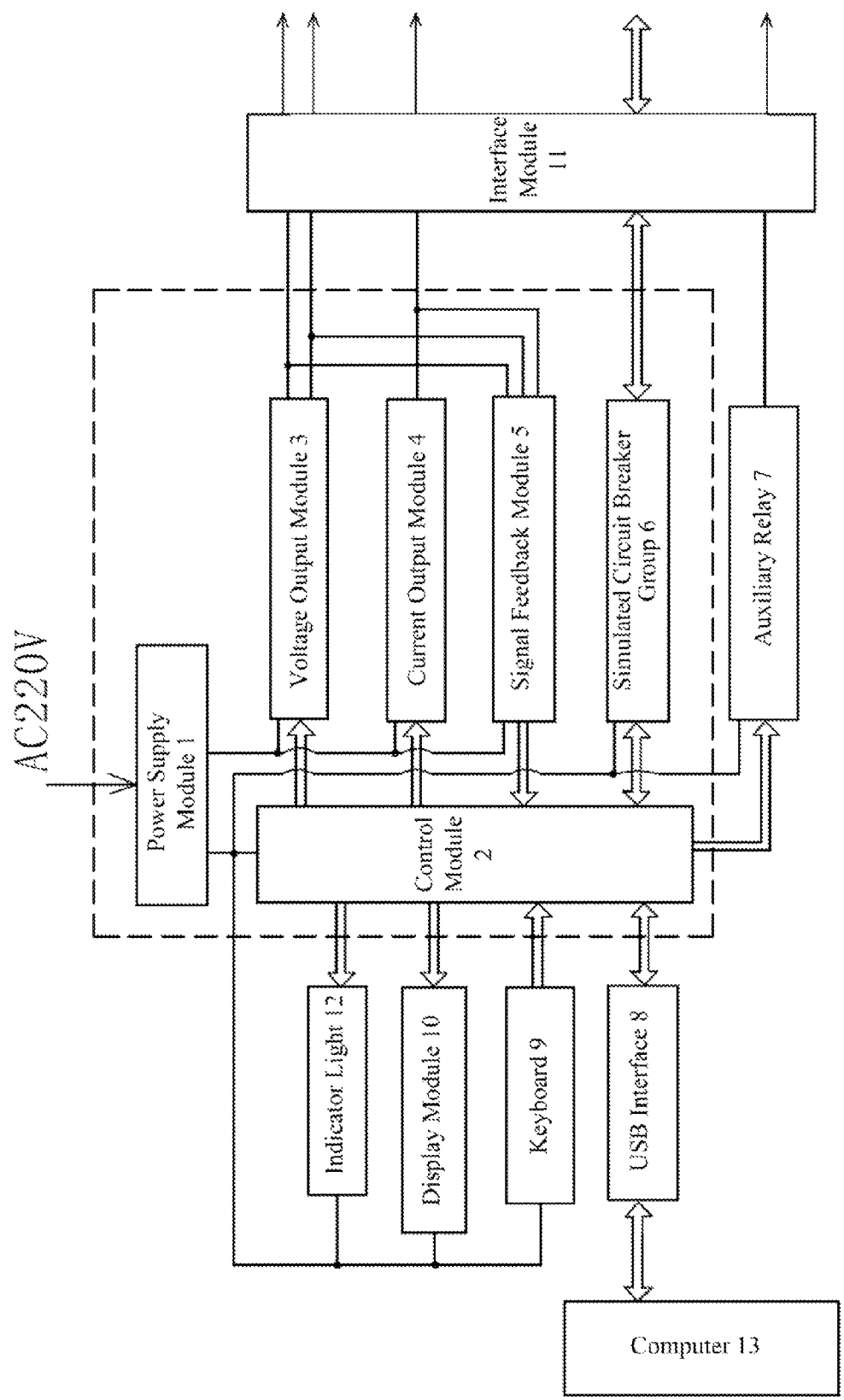
FIG. 1 is a block diagram of the circuit structure of the present invention.

Reference numbers in the figures: power supply module 1, control module 2, voltage output module 3, current output module 4, signal feedback module 5, simulated circuit-breaker group 6, auxiliary relay 7, USB interface 8, keyboard 9, display module 10, interface module 11, indicator light 12 and computer 13.

DETAILED DESCRIPTION

Drawings and embodiments are combined to further describe the present disclosure.

Embodiment 1

As shown in FIG. 1, the present embodiment provides an intelligent calibration system for backup-power automatic switching devices, which may mainly include a housing, a power supply module 1, a control module 2, a voltage output module 3, a current output module 4, a signal feedback module 5, a simulated circuit-breaker group 6, an auxiliary relay 7, a USB interface 8, a keyboard 9, a display module 10, an interface module 11, an indicator light 12 and a computer 13. The display module 10 may include a display driving circuit and a display screen. In the present embodiment, the display screen is preferably a TFT touch screen. The housing may be configured to have a panel. The housing is not shown in the figures.

The power supply module 1, the control module 2, the voltage output module 3, the current output module 4, the signal feedback module 5, the simulated circuit-breaker group 6 and the auxiliary relay 7 may be configured inside the housing. The USB interface 8, the keyboard 9, the display screen of the display module 10, the interface module 11 and the indicator light 12 may be configured on the panel of the housing.

The power supply module 1 may be configured to include a power input port, a first power output port and a second power output port. During operation, the power port of the power supply module 1 may be electrically connected to 220V AC mains supply. The first power output port of the power supply module 1 may output a 24V DC power supply. The second power output port of the power supply module 1 may output a 15V DC power supply. The power supply module 1 may provide operating power to the calibration apparatus.

The control module 2 may be configured to include a voltage output control port, a power output control port, a signal feedback input port, a simulated circuit-breaker signal port, an auxiliary relay control port, a USB communication port, a keyboard signal input port, a display signal input port, an indicator light signal output port and a power port.

The voltage output module 3 may be configured to include a control signal input port, a first voltage output port, a second voltage output port and a power port. The current output module 4 may be configured to include a control signal input port, a current output port and a power port. The signal feedback module 5 may be configured to include a first sampling signal port, a second sampling signal port, a third sampling signal port, a signal output port and a power port.

The simulated circuit-breaker group 6 may be configured to include a first signal port, a second signal port and a power port. The auxiliary relay 7 may be configured to include a control signal input port, an output port and a power port. The USB interface 8 may be configured to include a first communication port and a second communication port. The keyboard 9 may be configured to include a signal output port and a power port. The display module 10 may be configured to include a display signal input port and a power port. The interface module 11 may include an interface panel and a first voltage output connection terminal, a second voltage output connection terminal, a current output connection terminal, a row of simulated circuit-breaker connection terminals and an auxiliary relay output connection terminal configured on the interface panel. The indicator light 12 may be configured to include a control signal input port and a power port. The computer 13 may be configured to include a communication port.

The control signal input port of the voltage output module 3 and the voltage output control port of the control module 2 may be electrically connected. The first voltage output port of the voltage output module 3 and the first voltage output connection terminal of the interface module 11 may be electrically connected. The second voltage output port of the voltage output module 3 and the second voltage output connection terminal of the interface module 11 may be electrically connected. The control signal input port of the current output module 4 and the current output control port of the control module 2 may be electrically connected.

The current output port of the current output module 4 and the current output connection terminal of the interface module 11 may be electrically connected. The first sampling signal port of the signal feedback module 5 and the first voltage output port of the voltage output module 3 may be electrically connected. The second sampling signal port of the signal feedback module 5 and the second voltage output port of the voltage output module 3 may be electrically connected. The third sampling signal port of the signal feedback module 5 and the current output port of the current output module 4 may be electrically connected. The signal output port of the signal feedback module 5 and the feedback signal input port of the control module 2 may be electrically connected.

The first signal port of the simulated circuit-breaker group 6 and the simulated circuit-breaker signal port of the control module 2 may be electrically connected and have bidirectional signal connection. The second signal port of the simulated circuit-breaker group 6 and the row of simulated circuit-breaker connection terminals of the control module 2 may be electrically connected. The control signal input port of the auxiliary relay 7 and the auxiliary relay control port of the control module 2 may be electrically connected. The output port of the auxiliary relay 7 and the output connection terminal of the interface module 11 may be electrically connected.

The first communication port of the USB interface 8 and the USB communication port of the control module 2 may be electrically connected and have bidirectional signal connection. The second communication port of the USB interface 8 and the communication port of the computer 13 may be electrically connected and have bidirectional signal connection. The signal output port of the keyboard 9 and the keyboard signal input port of the control module 2 may be electrically connected. The display signal input port of the display module 10 and the display signal output port of the control module 2 may be electrically connected. The control signal input port of the indicator light 12 and the indicator light signal output port of the control module 2 may be electrically connected.

The power ports of the control module 2, the simulated circuit-breaker group 6, the auxiliary relay 7, the USB interface 8, the keyboard 9, the display module 10 and the indicator light 12 may be respectively electrically connected to the first power output port of the power supply module 1. The power ports of the voltage output module 3, the current output module 4 and the signal feedback module 5 may be respectively electrically connected to the second power output port of the power supply module 1.

In the present embodiment, the core device of the control module 2 may be a LPC2220 microcontroller, which has characteristics including small size, low power consumption, high performance and low cost. The simulated circuit-breaker group 6 may include eight simulated circuit-breakers which may be respectively named as DL1, DL2, DL3, DL4, DL5, DL6, DL7, and DL8. The connection terminals of the interface module 11 may preferably be MTK-P/P terminals manufactured by PHOENIX Corporation and equipped with RPS test plugs. The terminals may include controllable ports and specialized plugs, which may satisfy requirements of simplifying wiring connections at the testing site of the backup-power automatic switching device.

Figure 2:
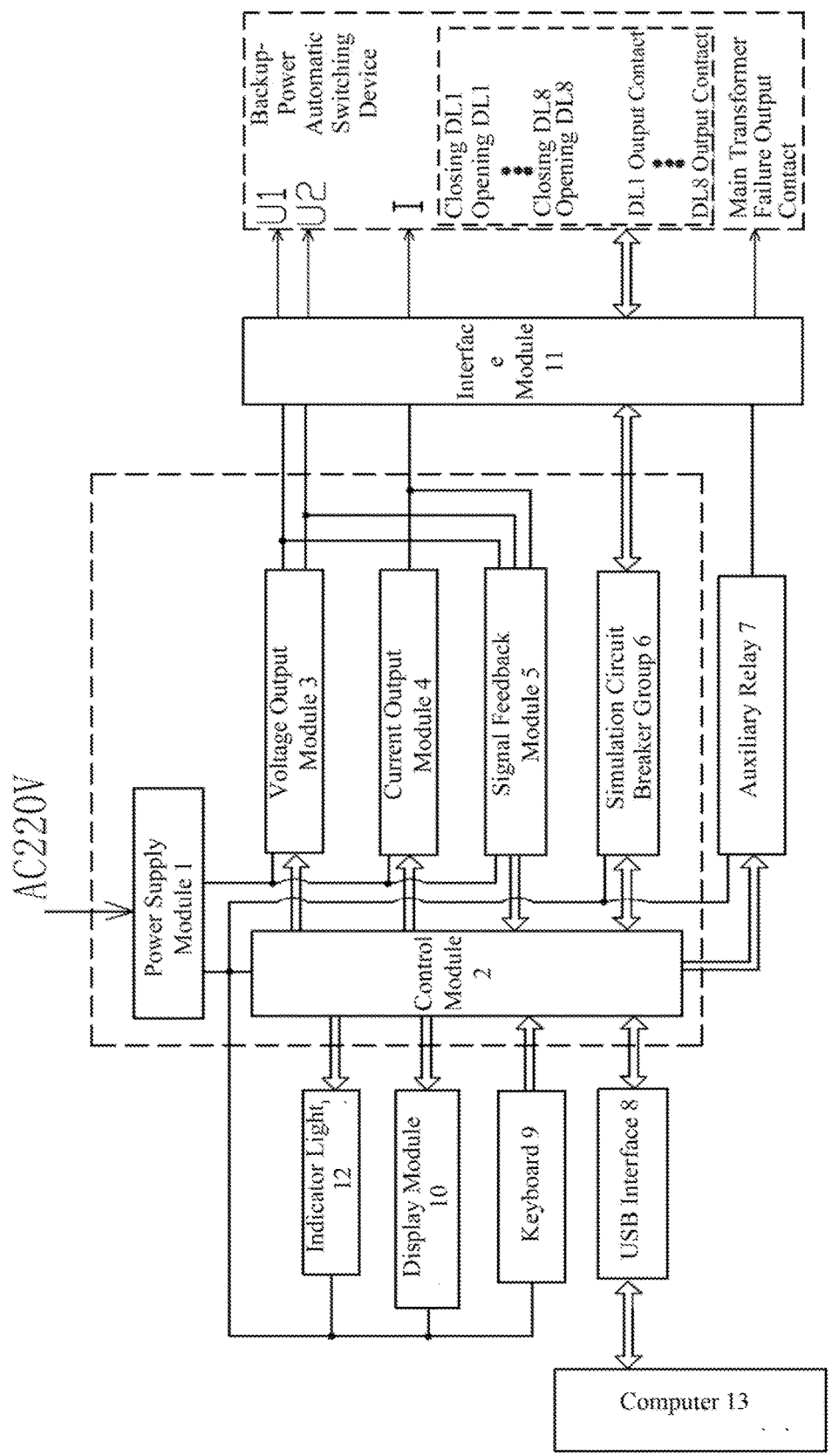
FIG. 2 is a schematic diagram of electrical connection relationships between the present invention shown in FIG. 1 and a backup-power automatic switching device.

As shown in FIG. 2, when the intelligent calibration system for backup-power automatic switching device disclosed in the present embodiment is in operation, plugs may be plugged into the connection terminals of the interface module 11. Power port U1, power port U2 and current port I of a to-be-tested backup-power automatic switching device may be respectively electrically connected to the first voltage output terminal, the second voltage output terminal and the current output terminal of the interface module 11. The simulated circuit-breaker connection terminals of the interface module 11 may be a group of connection terminals, and are respectively electrically connected to DL1 closing, DL1 opening, . . . , DL8 closing, and DL8 opening contacts of the to-be-tested backup-power automatic switching device. The auxiliary relay connection terminal of the interface module 11 may be electrically connected to the main transformer failure output contact of the to-be-tested backup-power automatic switching device.

Figure 3:
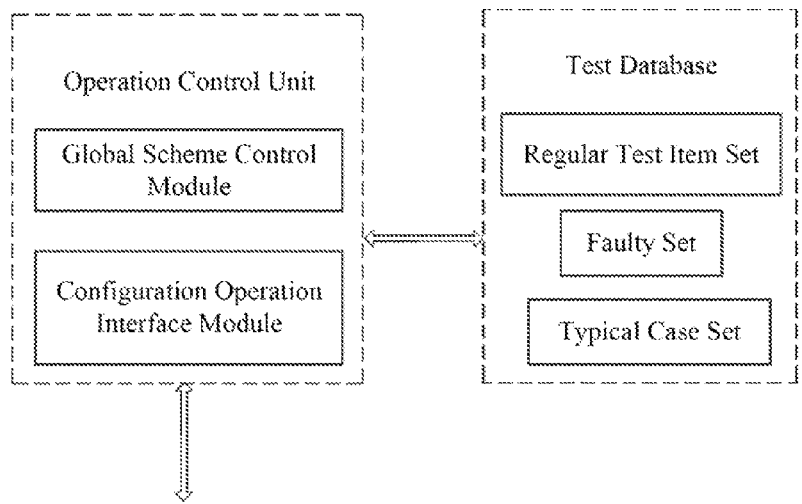
FIG. 3 is a structural diagram of built-in functional units of the computer shown in FIG. 1.

As shown in FIG. 3, the computer 13 may be configured to implement intelligent test control. The intelligent test control by the computer 13 may be realized through communications between the USB interface 8 and the control module 2. The computer 13 may include a built-in operation control unit and a built-in test database. The operation control unit may include two functional modules: a configuration operation interface module and a global scheme control module. The configuration operation interface may provide configuration program settings and human-machine interactive features, receive types and time stamps of switch-closing signals and switch-opening signals of the circuit-breaker through the USB interface 8 and the control module 2, and update related information in a main wiring diagram. When using the system, testing personnel may conveniently set any faulty situations using the interface of the computer 13, and perform test drills of special circumstances according to dispatching needs. The system is easy to operate.

The global scheme control module may send out simulation instructions of any faulty situations, and realize backup-power switching functions and sequential action control functions.

The test database of the computer 13 may include a regular test item set, a faulty set and a typical case set. The regular test project set may include logic test items, action time measurement items for the entire device group, and tests for the entire device group. The faulty set may include various categories of unusual states that may potentially occur in the system at one time. The typical case set may include various categories of regularly used testing schemes for BAS devices. By implementing a test database, the system may conveniently perform, on multiple devices under same conditions, logic tests, action time measurements for the entire device group, and tests for the entire device group, while avoiding the influence of human factors on the experiment results. Further, the experiment data obtained from the testing procedure may be used to update and self-correct the test database, thus the test accuracy may be enhanced. The intelligent calibration system for backup-power automatic switching devices disclosed in the present embodiment may have the following working principles and working process.

The control module 2 may communicate with the computer 13 through the USB interface 8, receive instructions from the computer 13 and send related information to the computer 3. The control module 2 may implement auxiliary contact detection, simulated circuit-breaker control, and indicator light control. The control module 2 may control the eight simulated circuit-breakers DL1 to DL8, receive switch-closing and switch-opening instructions from the BAS device, and implement specific logic controls.

The voltage output module 3 may use D/A to produce a voltage signal, and output a three-phase AC voltage signal after phase shifting and amplification. The current output module 4 may output continuous and adjustable AC current waveform under the control of the control module 2. The signal feedback module 5 may use a 14-bit A/D to sample the outputted voltage signal and current signal, and provide feedbacks to the control module 2 in real time. The display module 10 may use a 12-inch TFT touch screen to provide real-time presentation of testing procedure and results and to facilitate user interactions. The keyboard 9 may be configured to receive user input. The indicator light 12 may be configured to indicate working status of the calibration system in real time. The USB interface 8 may be configured as a communication interface.

Figure 4:
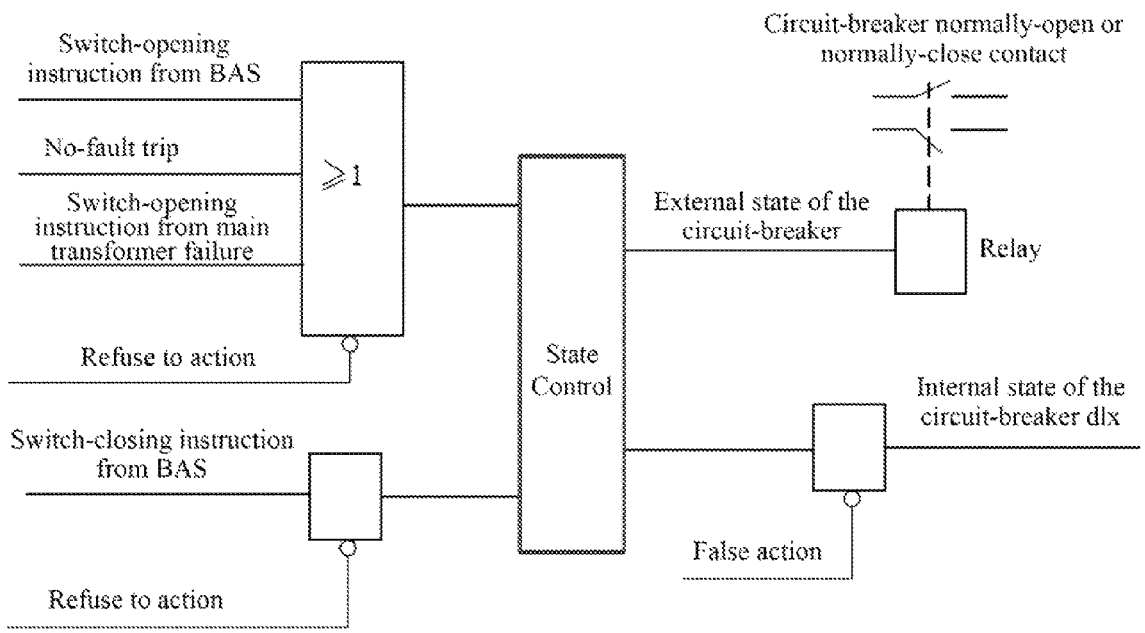
FIG. 4 is a control logic chart of the circuit-breaker in the present invention shown in FIG. 1.

As shown in FIG. 4, the simulated circuit-breaker in the simulated circuit-breaker group 6 may adopt logic control principles. The simulated circuit-breaker may receive an internal preset instruction from the control module 2, and switch-opening/switch-closing instructions from external BAS device (i.e., switch-opening/switch-closing pulses). No-fault trip is a switch-opening instruction from the calibration system, which is an internal instruction. The switch-opening instruction based on main transformer failure is a shared switch-opening instruction from multiple circuit-breakers corresponding to a specific main transformer. When being set as "refuse to action", a simulated circuit-breaker does not respond to any switch-opening or switch-closing instructions. When the internal state of a simulated circuit-breaker is dlx, a main-contact state of a circuit-breaker may be simulated to control voltage output and current output. Based on an external state of the simulated circuit-breaker, controlling an auxiliary contact of the circuit by a circuit-breaker may be simulated with selectable output logic.

When "positive logic" is selected, the circuit-breaker may close external switch and close the contact, or open the external switch and open the contact, vise versa when "negative logic" is selected. The state of the circuit-breaker may be transmitted to the display module 10 through the control module 2, and be displayed in real-time on the LCD. "After-closing/manual trip" output contact and the output contact of external state of the circuit-breaker may share a same contact. The contact may have one-to-one correspondence with a circuit-breaker. It may be selected between the "after-closing" and the "manual trip" function. The present invention may provide 4 lines of main transformer failure output contacts, and may configure the time duration of the main transformer failure. Meanwhile, the present invention may provide one line of fast-breaking output contact for simulating a fast-breaking button. When testing the fast-breaking functions, the pickup time of the fast-breaking output contact may be configured.

The intelligent calibration system for backup-power automatic switching devices disclosed in the present embodiment may simulate operations of eight circuit-breakers, and implement tests for BAS devices with wiring manners including internal bridge, expanded internal bridge, single bus line, three main transformers backup-power switching, etc., and for BAS devices with fast-breaking functions.

Accordingly, the intelligent calibration system for backup-power automatic switching devices disclosed in the present embodiment may employ plug-in connectors in the interface module, so that just plugs are used for connection when performing inspections or tests, thus wiring is convenient and fast. The system may be configured with a TFT touch screen on the housing, which may conveniently display operation interface and related information while facilitating users to input information. The operation is intuitive and simple; the overall test efficiency is thus improved.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

INDUSTRIAL APPLICABILITY AND ADVANTAGEOUS EFFECTS

The present invention has various advantageous effects.

(1) The intelligent calibration system of the backup-power automatic switch device disclosed in the present invention employs plug-in connectors in the interface module, so that just plugs are used for connection when performing inspections or tests, thus wiring is convenient and fast.

(2) The intelligent calibration system of the backup-power automatic switch device disclosed in the present invention provides a TFT touch screen on the housing, which may conveniently display operation interface and related information while facilitating users to input information. The operation is intuitive and simple; the overall inspection efficiency is thus improved.

(3) The intelligent calibration system of the backup-power automatic switch device disclosed in the present invention provides an indicator light for operators to easily grasp the status of the calibration system, and provides a keyboard to further facilitate operations.

(4) The intelligent calibration system of the backup-power automatic switch device disclosed in the present invention provides an operation control unit built within the computer. The testing personnel may conveniently configure any faulty situation. Test drills of special circumstances may be performed according to dispatching needs, and the system is easy to operate. By implementing a test database, the system may conveniently perform, on multiple devices under same conditions, logic tests, action time measurements for the entire device group, and testing projects for the entire device group, while avoiding the influence of human factors on the testing results. Further, the test data obtained from the test procedure may be used to update and self-correct the test database, thus the testing accuracy may be enhanced.

What is claimed is:

1. An intelligent calibration system for backup-power automatic switching devices, comprising: a power supply module 1, a control module 2, a voltage output module 3, a current output module 4, a signal feedback module 5, a simulated circuit-breaker group 6, an auxiliary relay 7, a USB interface 8, a keyboard 9, a display module 10, an interface module 11, an indicator light 12 and a computer 13, wherein:

the power supply module 1 is configured to include a power input port, a first power output port and a second power output port;

the control module 2 is configured to include a voltage output control port, a power output control port, a signal feedback input port, a simulated circuit-breaker signal port, an auxiliary relay control port, a USB communication port, a keyboard signal input port, a display signal input port, an indicator light signal output port and a power port;

the voltage output module 3 is configured to include a control signal input port, a first voltage output port, a second voltage output port and a power port;

the current output module 4 is configured to include a control signal input port, a current output port and a power port;

the signal feedback module 5 is configured to include a first sampling signal port, a second sampling signal port, a third sampling signal port, a signal output port and a power port;

the simulated circuit-breaker group 6 is configured to include a first signal port, a second signal port and a power port;

the auxiliary relay 7 is configured to include a control signal input port, an output port and a power port;

the USB interface 8 is configured to include a first communication port and a second communication port;

the keyboard 9 is configured to include a signal output port and a power port;

the display module 10 is configured to include a display signal input port and a power port;

the interface module 11 includes an interface panel and a first voltage output connection terminal, a second voltage output connection terminal, a current output connection terminal, a row of simulated circuit-breaker connection terminals and an auxiliary relay output connection terminal configured on the interface panel;

the indicator light 12 is configured to include a control signal input port and a power port; the computer is configured to include a communication port;

the control signal input port of the voltage output module 3 and the voltage output control port of the control module 2 are electrically connected;

the first voltage output port of the voltage output module 3 and the first voltage output connection terminal of the interface module 11 are electrically connected;

the second voltage output port of the voltage output module 3 and the second voltage output connection terminal of the interface module 11 are electrically connected;

the control signal input port of the current output module 4 and the current output control port of the control module 2 are electrically connected;

the current output port of the current output module 4 and the current output connection terminal of the interface module 11 are electrically connected;

the first sampling signal port of the signal feedback module 5 and the first voltage output port of the voltage output module 3 are electrically connected;

the second sampling signal port of the signal feedback module 5 and the second voltage output port of the voltage output module 3 are electrically connected;

the third sampling signal port of the signal feedback module 5 and the current output port of the current output module 4 are electrically connected;

the signal output port of the signal feedback module 5 and the feedback signal input port of the control module 2 are electrically connected;

the first signal port of the simulated circuit-breaker group 6 and the simulated circuit-breaker signal port of the control module 2 are electrically connected and have bidirectional signal connection;

the second signal port of the simulated circuit-breaker group 6 and the row of simulated circuit-breaker connection terminals of the control module 2 are electrically connected;

the control signal input port of the auxiliary relay 7 and the auxiliary relay control port of the control module 2 are electrically connected;

the output port of the auxiliary relay 7 and the output connection terminal of the interface module 11 are electrically connected;

the first communication port of the USB interface 8 and the USB communication port of the control module 2 are electrically connected and have bidirectional signal connection;

the second communication port of the USB interface 8 and the communication port of the computer 13 are electrically connected and have bidirectional signal connection;

the signal output port of the keyboard 9 and the keyboard signal input port of the control module 2 are electrically connected;

the display signal input port of the display module 10 and the display signal output port of the control module 2 are electrically connected;

the control signal input port of the indicator light 12 and the indicator light signal output port of the control module 2 are electrically connected;

the power ports of the control module 2, the simulated circuit-breaker group 6, the auxiliary relay 7, the USB interface 8, the keyboard 9, the display module 10 and the indicator light 12 are respectively electrically connected to the first power output port of the power supply module 1; and the power ports of the voltage output module 3, the current output module 4 and the signal feedback module 5 are respectively electrically connected to the second power output port of the power supply module 1.

2. The intelligent calibration system for backup-power automatic switching devices according to claim 1, further comprising a housing, wherein:
- the housing includes a panel; the display module 10 includes a display driving circuit and a display screen;
- the power supply module 1, the control module 2, the voltage output module 3, the current output module 4, the signal feedback module 5, the simulated circuit-breaker group 6, the auxiliary relay 7 and the driving circuit of the display module 10 are configured inside the housing; and
- the USB interface 8, the keyboard 9, the display screen of the display module 10, the interface module 11 and the indicator light 12 are configured on the panel of the housing.

3. The intelligent calibration system for backup-power automatic switching devices according to claim 2, wherein:
- the control module 2 includes an LPC2220 microcontroller;
- the simulated circuit-breaker group 6 includes eight simulated circuit-breakers; and
- the row of simulated circuit-breaker connection terminals of the control module includes eight groups and a total of 16 connection terminals.

4. The intelligent calibration system for backup-power automatic switching devices according to claim 3, wherein the connection terminals of the interface module 11 are MTK-P/P terminals manufactured by PHOENIX Corporation; and the display screen of the display module 10 is a TFT touch screen.

5. The intelligent calibration system for backup-power automatic switching devices according to claim 4, wherein the computer includes an operation control unit having a configuration operation interface and a global scheme control module, and a testing database containing regular testing item set, faulty set and typical case set, and which performs global control over the testing process.

\* \* \* \* \*